United States Patent
Ergun et al.

(10) Patent No.: US 11,764,795 B2
(45) Date of Patent: Sep. 19, 2023

(54) FRACTIONAL PHASE LOCKED LOOP (PLL) WITH DIGITAL CONTROL DRIVEN BY CLOCK WITH HIGHER FREQUENCY THAN PLL FEEDBACK SIGNAL

(71) Applicant: QUALCOMM Incorporated, San Diego, CA (US)

(72) Inventors: Burcin Serter Ergun, Poway, CA (US); Julian Puscar, Cary, NC (US); Zhiqin Chen, San Diego, CA (US); Dewanshu Chhagan Sewake, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 0 days.

(21) Appl. No.: 17/537,264

(22) Filed: Nov. 29, 2021

(65) Prior Publication Data
US 2023/0170911 A1    Jun. 1, 2023

(51) Int. Cl.
*H03D 3/24* (2006.01)
*H03L 7/197* (2006.01)
(Continued)

(52) U.S. Cl.
CPC .......... *H03L 7/1974* (2013.01); *H03L 7/0807* (2013.01); *H03L 7/0891* (2013.01); *H03L 7/099* (2013.01); *H04L 7/0079* (2013.01)

(58) Field of Classification Search
CPC ... H03L 7/1974; H03L 7/0891; H03L 7/0807; H03L 7/099; H03L 7/087; H03C 3/0958; G06F 1/08
(Continued)

(56) References Cited

U.S. PATENT DOCUMENTS 8,432,231 B2    4/2013    Nelson et al.
9,244,484 B2    1/2016    Ciesla et al.
(Continued)

FOREIGN PATENT DOCUMENTS

| CN | 101272144 A | 9/2008 |
| CN | 104601171 A | 5/2015 |
| WO | 2004100380 A1 | 11/2004 |

OTHER PUBLICATIONS

English translation for CN 101272144, published on Sep. 24, 2008.*
(Continued)

*Primary Examiner* — Phuong Phu
(74) *Attorney, Agent, or Firm* — Loza & Loza, LLP (57) ABSTRACT

A phase locked loop (PLL) method includes generating a first signal based on a comparison of a phase of a reference clock or signal to a phase of a feedback clock; generating an output clock based on the first signal; generating an intermediate feedback clock including frequency dividing the output clock; fractionally frequency dividing the intermediate feedback clock based on a digital control signal to generate the feedback clock; and generating the digital control signal based on a sampling clock having a frequency greater than a frequency of the feedback clock. In one implementation, a PLL includes a frequency multiplier to generate the sampling clock based on the feedback clock. In another implementation, a PLL uses the intermediate feedback clock as the sampling clock.

20 Claims, 4 Drawing Sheets

(51) Int. Cl.
*H03L 7/08* (2006.01)
*H03L 7/089* (2006.01)
*H03L 7/099* (2006.01)
*H04L 7/00* (2006.01)

(58) Field of Classification Search
USPC .................................................. 375/373–376
See application file for complete search history.

(56) References Cited

U.S. PATENT DOCUMENTS

| | | |
|---|---|---|
| 10,396,808 B2 | 8/2019 | Sun |
| 10,511,315 B1 | 12/2019 | Sarda |
| 2005/0213697 A1* | 9/2005 | Adachi ................ H03C 3/0958 |
| | | 375/376 |
| 2011/0037505 A1 | 2/2011 | Kawamoto |
| 2013/0086410 A1* | 4/2013 | Kurd ........................ G06F 1/08 |
| | | 327/157 |
| 2013/0285722 A1 | 10/2013 | Chou |
| 2014/0159787 A1* | 6/2014 | Hsu ........................ H03L 7/087 |
| | | 327/155 |
| 2019/0215142 A1 | 7/2019 | Meninger |

OTHER PUBLICATIONS

International Search Report and Written Opinion—PCT/US2022/049299—ISA/EPO—dated Mar. 16, 2023.

* cited by examiner

FRACTIONAL PHASE LOCKED LOOP (PLL) WITH DIGITAL CONTROL DRIVEN BY CLOCK WITH HIGHER FREQUENCY THAN PLL FEEDBACK SIGNAL

FIELD

Aspects of the present disclosure relate generally to phase locked loop (PLL), and in particular, to a fractional PLL including a digital control for a fractional divider driven by a clock having a frequency higher than a feedback signal of the PLL.

BACKGROUND

Fractional phase locked loops (PLLs) are employed in many types of circuits, such as in a clock and data recovery (CDR) used in a serializer/deserializer data transmission system, as a frequency synthesizer in a local oscillator (LO) transceiver system, and others. In certain applications, there may be a need to generate a PLL clock with reduced jitter due to quantization noise. One of the main sources of jitter in a fractional PLL is the digital control circuit for controlling a fractional frequency divider in the feedback loop of the PLL.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to a phase locked loop (PLL). The PLL includes a fractional frequency divider; a phase detector including a first input configured to receive a reference clock or signal, and a second input coupled to an output of the fractional frequency divider; a voltage-controlled oscillator (VCO) including an input coupled to an output of the phase detector, and an output coupled to a first input of the fractional frequency divider; and a digital control circuit including a frequency multiplier including a first input coupled to the output of the fractional frequency divider, wherein the digital control circuit includes an output coupled to a second input of the fractional frequency divider.

Another aspect of the disclosure relates to a phase locked loop (PLL). The includes a fractional frequency divider; an integer frequency divider including an output coupled to a first input of the fractional frequency divider; a phase detector including a first input configured to receive a reference clock or signal, and a second input coupled to an output of the fractional frequency divider; a voltage-controlled oscillator (VCO) including an input coupled to an output of the phase detector, and an output coupled to an input of the integer frequency divider; and a digital control circuit including a first input coupled to the output of the integer frequency divider, and an output coupled to a second input of the fractional frequency divider.

Another aspect of the disclosure relates to a method. The method includes generating a first signal based on a comparison of a phase of a reference clock or signal to a phase of a feedback clock; generating an output clock based on the first signal; generating an intermediate feedback clock including frequency dividing the output clock; fractionally frequency dividing the intermediate feedback clock based on a digital control signal to generate the feedback clock; and generating the digital control signal based on a sampling clock having a frequency greater than a frequency of the feedback clock.

Another aspect of the disclosure relates to a data receiver. The data receiver includes: a receiver circuit configured to generate a serial data signal based on a transmit data signal received from a data transmitter via one or more transmission lines; a clock and data recovery (CDR) configured to generate a receive clock based on the serial data, signal; and a deserializer configured to generate a set of parallel data signals based on the serial data signal using the receive clock. The CDR includes: a fractional frequency divider; a phase detector including a first input configured to receive the serial data signal, and a second input coupled to an output of the fractional frequency divider; a voltage-controlled oscillator (VCO) including an input coupled to an output of the phase detector, and an output coupled to a first input of the fractional frequency divider; and a digital control circuit including a frequency multiplier including an input coupled to the output of the fractional frequency divider, wherein the digital control circuit includes an output coupled to a second input of the fractional frequency divider.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may he employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may he practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
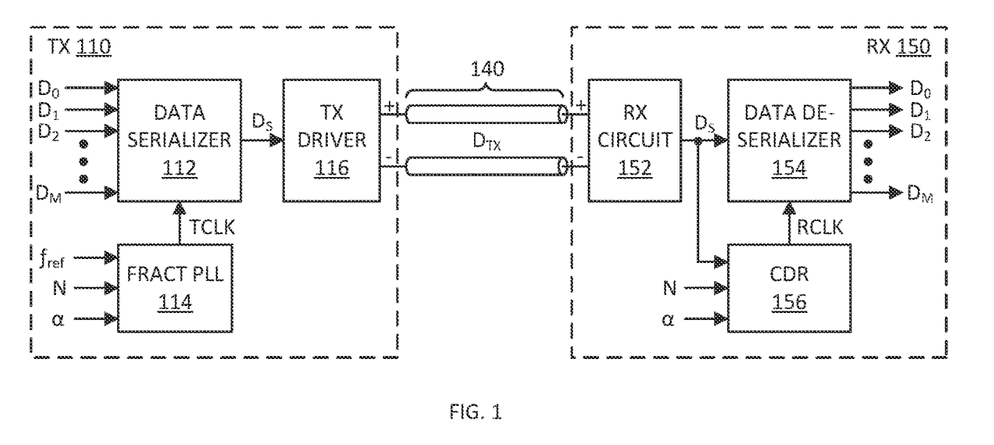
FIG. 1 illustrates a block diagram of an example data transmission system in accordance with an aspect of the disclosure.

FIG. 1 illustrates a block diagram of an example data transmission system 100 in accordance with an aspect of the disclosure. The data transmission system 100 may he used in several different data transmission systems, such as used in Universal Flash Storage (UFS), Peripheral Component Interconnect Express (PCIE), Universal Serial Bus (USB), and other applications. As discussed further herein, the data transmission system 100 may use a fractional phase lock loop (PLL) on the transmitter-side, and a similar fractional PLL as part of a clock and data recovery (CDR) on the receiver-side, whereby each includes a digital control circuit for setting or controlling a divider radio of a fractional frequency divider that may introduce significant quantization noise to the output clock of the PLL and CDR. As used herein, a clock is a substantially periodic waveform used to drive (e.g., propagate data in) digital circuits. A signal, as used herein, carries or is modulated with data or information.

More specifically, the data transmission system 100 includes a transmitter 110, a receiver 150, and one or more transmission lines 140 (e.g., differential+/−data transmission lines) coupling the transmitter 110 to the receiver 150. The transmitter 110, in turn, includes a data serializer 112, a fractional phase lock loop (PLL) 114, and a transmit driver 116. The data serializer 112 is configured to receive a set of parallel data signals $D_0$ to $D_M$, and serialize the set of parallel data signals $D_0$ to $D_M$ using a transmit clock (TCLK) to generate a serial data signal $D_S$. The fractional PLL 114 is configured to generate the transmit clock (TCLK) based on a reference clock $f_{ref}$, a first signal indicating an integer divisor N, and a second signal indicating a fractional divisor α. As an example, the frequency of the transmit clock (TCLK) may be related to the frequency of the reference clock $f_{ref}$ multiplied by a sum of the integer and fractional divisors (e.g., TCLK~$f_{ref}$*N·α). The transmit driver 116 is configured to voltage level shift the serial data signal $D_S$ to generate a transmit data signal $D_{TX}$ for transmission to the receiver 150 via the one or more transmission lines 140.

The receiver 150, in turn, includes a receiver circuit 152, a data deserializer 154, and a clock and data recovery (CDR) 156. The receiver circuit 152 is configured to receive and process the transmit data signal $D_{TX}$ to regenerate the serial data signal $D_S$. The serial data signal $D_S$ generated by the receiver circuit 152 may be substantially the same as the serial data signal $D_S$ generated by the data serializer 112 of the transmitter 110; but due to the effects of the transmission tines 140 on the transmit data signal $D_{TX}$ the capabilities of the receiver circuit 152, and other factors, there may he sonic minor differences between the two serial data signals $D_S$.

The receiver circuit 152 may include a variable gain amplifier (VGA) and an equalizer (e.g., a continuous time linear equalizer (CTLE) or a decision feedback equalizer (DFE)). The data deserializer 154 is configured to regenerate the set of parallel data signals $D_0$ to $D_M$ based on the serial data signal $D_S$ using a receive clock (RCLK). The CDR 156 is configured to generate the receive clock (RCLK) based on the serial data signal $D_S$ generated by the receiver circuit 152, the first signal indicating the integer divisor N, and the second signal indicating the fractional divisor α. Similarly, the frequency of the receive clock (RCLK) may be related to the data rate of the serial data signal $D_S$ multiplied by a sum of the integer and fractional divisors (e.g., RCLK~$D_S$*N·α).

Figure 2:
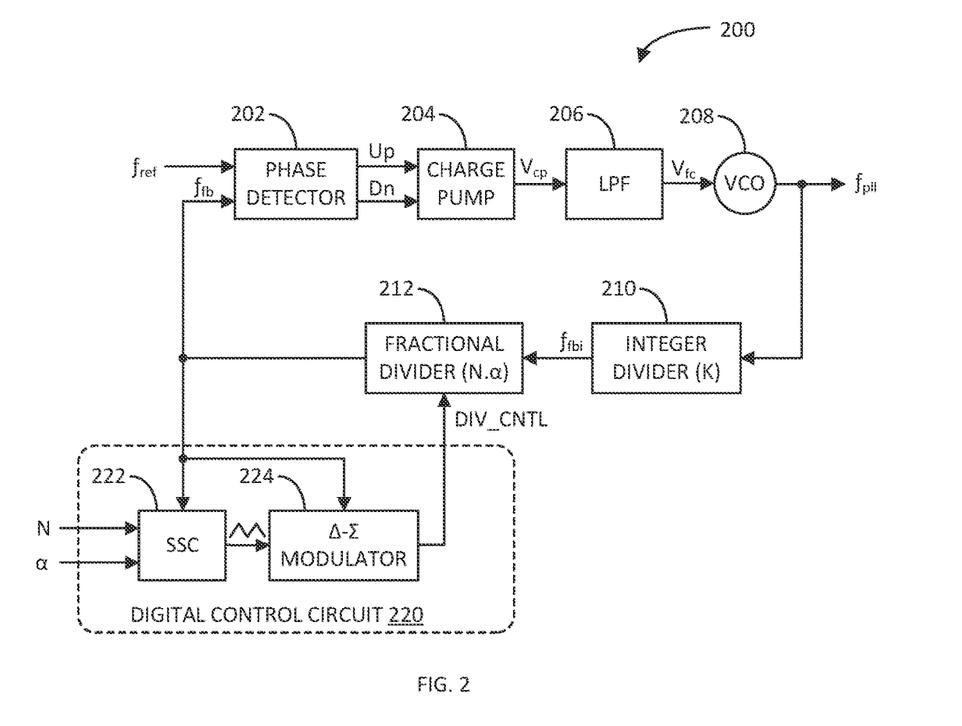
FIG. 2 illustrates a block diagram of an example fractional phase locked loop (PLL) in accordance with another aspect of the disclosure.

FIG. 2 illustrates a block diagram of an example fractional phase locked loop (PLL) 200 in accordance with another aspect of the disclosure. The fractional PLL 200 may be an example detailed implementation of the fractional PLL 114 and/or the CDR 156 of the data transmission system 100 previously discussed. In particular, the fractional PLL 200 includes a phase detector 202, a charge pump 204, a low pass filter (LPF) 206, a voltage-controlled oscillator (VCO) 208, an integer frequency divider 210, and a fractional frequency divider 212. The fractional PLL 200 further includes a digital control circuit 220 for the fractional frequency divider 212, including a spread spectrum clock (SSC) 222 and a delta-sigma (Δ-Σ) modulator 224 (e.g., a third-order or other order Δ-Σ modulator).

The phase detector 202 compares the phase of a reference clock or signal $f_{ref}$ with the phase of a feedback clock $f_{fb}$ to generate Up (charging) and Down or Dn (discharging) control signals for the charge pump 204. With regard to the fractional PLL 114 of the data transmission system 100, the reference clock $f_{ref}$ in PLL 200 is the same as the reference clock $f_{ref}$ provided to the PLL 114. With regard to the CDR 156 of the data transmission system 100, the reference signal $f_{ref}$ in PLL 200 is the same as the serial data signal $D_S$ provided to the CDR 156. The Up signal may indicate that the phase of the feedback clock $f_{fb}$ lags the phase of the reference clock or signal $f_{ref}$. The Dn signal may indicate that the feedback clock $f_{fb}$ leads the phase of the reference clock or signal $f_{ref}$.

In response to the control signals Up and Dn, the charge pump 204 generates a charge pump signal $V_{cp}$, which may be related to or a measure of a phase difference between the reference clock $f_{ref}$ and a feedback clock $f_{fb}$. The LPF 206 integrates the charge pump signal $V_{cp}$ to generate a frequency control signal $V_{fc}$. The VCO 208 generates a PLL output clock $f_{pll}$ based on the frequency control signal $V_{fc}$. The integer frequency divider 210 frequency divides the PLL output clock $f_{pll}$ by an integer K to generate an intermediate feedback clock $f_{fbi}$ (e.g., $f_{fbi}=f_{pll}/K$). The fractional frequency divider 212 frequency divides the intermediate feedback clock $f_{fbi}$ by a number N·α to generate the feedback clock $f_{fb}$ (e.g., $f_{fb}=f_{fbi}/N·α$), wherein N is the integer divisor and α is the fractional divisor.

The digital control circuit 220 is configured to control the fractional frequency divider 212 such that it divides the frequency of the intermediate feedback signal $f_{fbi}$ by N·α. In this regard, the SSC 222 of the digital control circuit 220 is configured to receive a first signal indicative of the integer divisor N and a second signal indicative of the fractional divisor α, and generate a digital triangular waveform having a mean of N·α at a sampling rate dictated by the feedback clock $f_{fb}$. For example, the upper peak of the digital triangular waveform may be equal to N·α+Δ, and the lower peak of the digital triangular waveform may be equal to N·α+Δ, where Δ is a target deviation of the divider ratio N·α. A purpose of the SSC 222 is to spread the power of frequency tones in the PLL output clock $f_{pll}$ due to the digital control circuit 220 across a range of frequencies dictated by the digital triangular waveform; otherwise, the power may become highly concentrated at individual tones, which may produce significant unwanted spurs in the PLL output clock $f_{pll}$.

The delta-sigma (Δ-Σ) modulator 224 is configured to generate a divider control signal DIV_CNTL including a digital sequence of integers that tracks the digital triangular waveform generated by the SSC 222; which, as discussed, has a mean equal to the divider ratio N·α of the fractional frequency divider 212. In this implementation, the divider control signal DIV_CNTL has a sampling rate also dictated by the feedback clock $f_{fb}$. The divider control signal DIV_CNTL is provided to the fractional frequency divider 212, which divides the intermediate feedback clock $f_{fbi}$ by the integer set by the digital sequence per a given cycle of the sampling clock $f_{fb}$. As the digital sequence varies with a mean of N·α, the fractional frequency divider 212. divides the frequency of the intermediate feedback clock $f_{fbi}$ by divider ratio N·α.

Due to the digital nature of the digital control circuit 220, the fractional frequency divider 212 divides the intermediate feedback clock $f_{fbi}$ by an integer per cycle of the sampling clock $f_{fb}$, where the integer is varied to achieve a mean of N·α, i.e., the divider ratio of the fractional frequency divider 212. As a result of the digital control, the is jitter in the PLL output clock $f_{pll}$ due to quantization noise introduced by the digital control circuit 220, which may cause issues with the serialization and parallelization of the data signals by the data serializer 112 and the data deserializer 154, respectively (e.g., generally, issues with proper operation of digital circuits driven by the fractional PLL 200).

Figure 3:
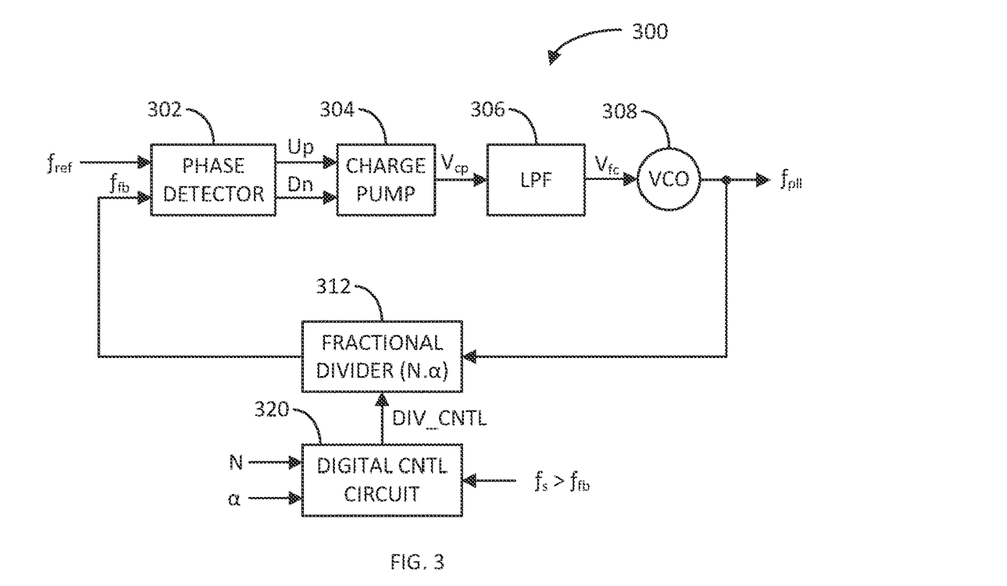
FIG. 3 illustrates a block diagram of another example fractional phase locked loop (PLL) in accordance with another aspect of the disclosure.

FIG. 3 illustrates a block diagram of another example fractional phase locked loop (PLL) 300 in accordance with another aspect of the disclosure. As discussed with reference to PLL 200, the digital control circuit 220 is driven by the feedback clock $f_{fb}$. However, the amount of quantization noise present in the PLL output clock $f_{pll}$ is inversely proportional to the frequency of the feedback clock $f_{fb}$. Additionally, the frequency separation between the PLL output clock $f_{pll}$ and the quantization noise is also directly related (e.g., proportional) to the frequency of the feedback clock $f_{fb}$. Thus, to reduce the quantization noise and move it farther away in frequency from the PLL output clock $f_{pll}$, it is desirable to increase the sampling frequency at which the digital control circuit is driven.

In this regard, the fractional PLL 300 includes a phase detector 302, a charge pump 304, a low pass filter (LPF) 306, a voltage-controlled oscillator (VCO) 308, and a fractional frequency divider 312. These elements of the fractional PLL 300 correspond to the same elements 202, 204, 206, 208, and 212 of the fractional PLL 200 previously discussed in detail, respectively. Although not shown in FIG. 3, the PLL 300 may also include an integer frequency divider coupled between the VCO 308 and the fractional frequency divider 312.

The fractional PLL 300 also includes a digital control circuit 320 for the fractional frequency divider 312. Similar to the digital control circuit 220, the digital control circuit 320 is configured to generate a divider control signal DIV_CNTL based on a first signal indicating the integer divisor N and a second signal indicating the fractional divisor α. However, in this example, the digital control circuit 320 is driven by a sampling clock $f_s$ having a frequency greater than the frequency of the feedback clock $f_{fb}$ (e.g., $f_s > f_{fb}$). In this way, the quantization noise in the PLL output clock $f_{pll}$ is lower and farther away in frequency from the PLL output clock $f_{pll}$ compared to the quantization noise in the PLL output clock $f_{pll}$ generated by PLL 200. This may result it less operational issues for digital circuits driven by the PLL output clock $f_{pll}$ generated by fractional PLL 300.

Figure 4:
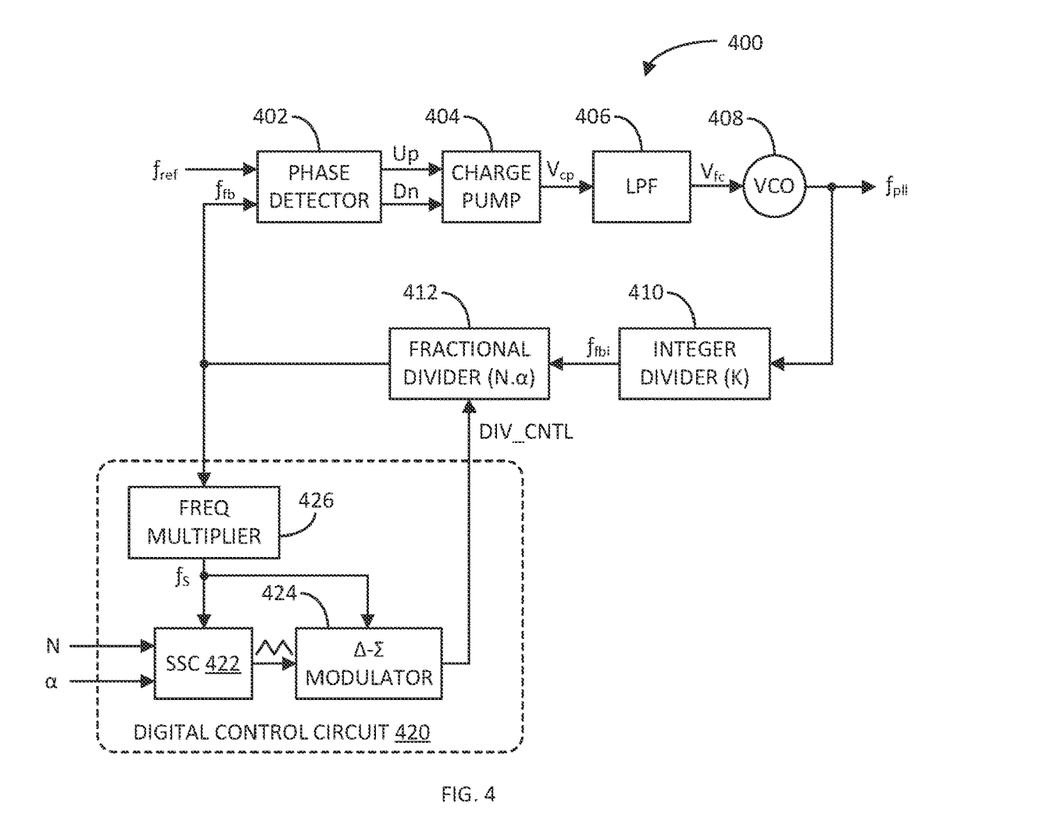
FIG. 4 illustrates a block diagram of another example fractional phase locked loop (PLL) in accordance with another aspect of the disclosure.

FIG. 4 illustrates a block diagram of another example fractional phase locked loop (PLL) 400 in accordance with another aspect of the disclosure. In PLL 400, the sampling clock driving a digital control circuit for a fractional frequency divider is generated by frequency multiplying the feedback clock $f_{fb}$ generated by the fractional frequency divider. As previously discussed, the higher sampling clock frequency for the digital control circuit reduces the quantization noise introduced by the digital control circuit, and further frequency separate the quantization noise from the PLL output clock $f_{pll}$, resulting in significant jitter reduction in the PLL output clock $f_{pll}$.

in particular, the fractional 400 includes a phase detector 402, a charge pump 404, a low pass filter (LPF) 406, a voltage-controlled oscillator (VCO) 408, an integer frequency divider 410, and a fractional frequency divider 412. The PLL 400 further includes a digital control circuit 420 for the fractional frequency divider 412. In this example, the digital control circuit 420 includes a frequency multiplier 426, a spread spectrum clock (SSC) 422, and a delta-sigma (Δ-Σ) modulator 424.

The phase detector 402 compares the phase of a reference clock or signal $f_{ref}$ with the phase of a feedback clock $f_{fb}$ to generate Up (charging) and Down or Dn (discharging) control signals for the charge pump 404. With regard to the fractional PLL 114 of the data transmission system 100, the reference clock $f_{ref}$ in PLL 400 is the same as the reference clock $f_{ref}$ provided to the PLL 114. With regard to the CDR 156 of the data transmission system 100, the reference signal $f_{ref}$ in PLL 400 is the same as the serial data signal $D_S$ provided to the CDR 156.

In response to the control signals Up and Dn, the charge pump 404 generates a charge pump signal $V_{cp}$, which may be related to or a measure of a phase difference between the reference clock or signal $f_{ref}$ and the feedback clock $f_{fb}$. The LPF 406 integrates the charge pump signal $V_{cp}$ to generate a frequency control signal $V_{fc}$. The VCO 408 generates a PLL output clock $f_{pll}$ based on the frequency control signal $V_{fc}$. The integer frequency divider 410 frequency divides the PLL output clock $f_{pll}$ by an integer K to generate an intermediate feedback clock $f_{fbi}$ (e.g., $f_{fbi}=f_{pll}/K$). The fractional frequency divider 412 frequency divides the intermediate feedback clock $f_{fbi}$ by a number N·α to generate the feedback clock $f_{fb}$ (e.g., $f_{fb}=f_{fbi}/N·α$), wherein N is the integer divisor and a is the fractional divisor.

The digital control circuit 420 is configured to control the fractional frequency divider 412 such that it divides the frequency of the intermediate feedback signal $f_{fbi}$ by N·α. In this regard, the SSC 422 of the digital control circuit 420 is configured to receive a first signal to set the integer divisor N and a second signal to set the fractional divisor α, and generates a digital triangular waveform having a mean of N·α (e.g., with peaks at N·α±Δ) with a sampling rate dictated by a sampling clock $f_s$. The frequency multiplier 426 generates the sampling clock $f_s$ by frequency multiplying the feedback clock $f_{fb}$. For example, the frequency multiplier 426 may be a frequency doubler, where the frequency of the sampling clock $f_s$ is twice the frequency of the feedback clock $f_{fb}$. More generally, the frequency multiplier 426 may multiply the frequency of the feedback clock $f_{fb}$ by b $2^Q$ to generate the sampling clock $f_s$, where Q is positive integer. As previously discussed, the purpose of the SSC 422 is to spread the power of frequency tones in the PLL output clock $f_{pll}$ generated by the digital control circuit 420 across a range of frequencies dictated by the digital triangular waveform; otherwise, the power would be highly concentrated in a smaller number of individual tones.

The delta-sigma (Δ-Σ) modulator 424 is configured to generate a divider control signal DIV_CNTL including a digital sequence of integers that tracks the digital triangular waveform generated by the SSC 422; which, as discussed, has a mean N·α. In this implementation, the divider control signal DIV_CNTL has a sampling rate also dictated by the sampling clock $f_s$. The divider control signal DIV_CNTL is provided to the fractional frequency divider 412, which divides the intermediate feedback clock $f_{bi}$ by the integer set by the digital sequence per a given cycle of the sampling clock $f_s$.

Due to the digital nature of the digital control circuit 420, the fractional frequency divider 412 divides the intermediate feedback clock $f_{fbi}$ by an integer per cycle of the sampling clock $f_s$, where the integer is varied to achieve a mean of N·α, i.e., the divider ratio of the fractional frequency divider 412. However, because of the frequency multiplier 426 generating the sampling clock $f_s$ by frequency multiplying the feedback clock $f_{fb}$, the SSC 422 and delta-sigma (Δ-Σ) modulator 424 are clocked at a higher rate or frequency compared to the feedback clock $f_{fb}$. As a result, the output PLL clock $f_{pll}$ has reduced quantization noise, and the quantization noise is pushed higher in frequency away from the fundamental frequency of the output PLL clock $f_{pll}$; allowing the LPF 406 to further filter out the quantization noise.

Figure 5:
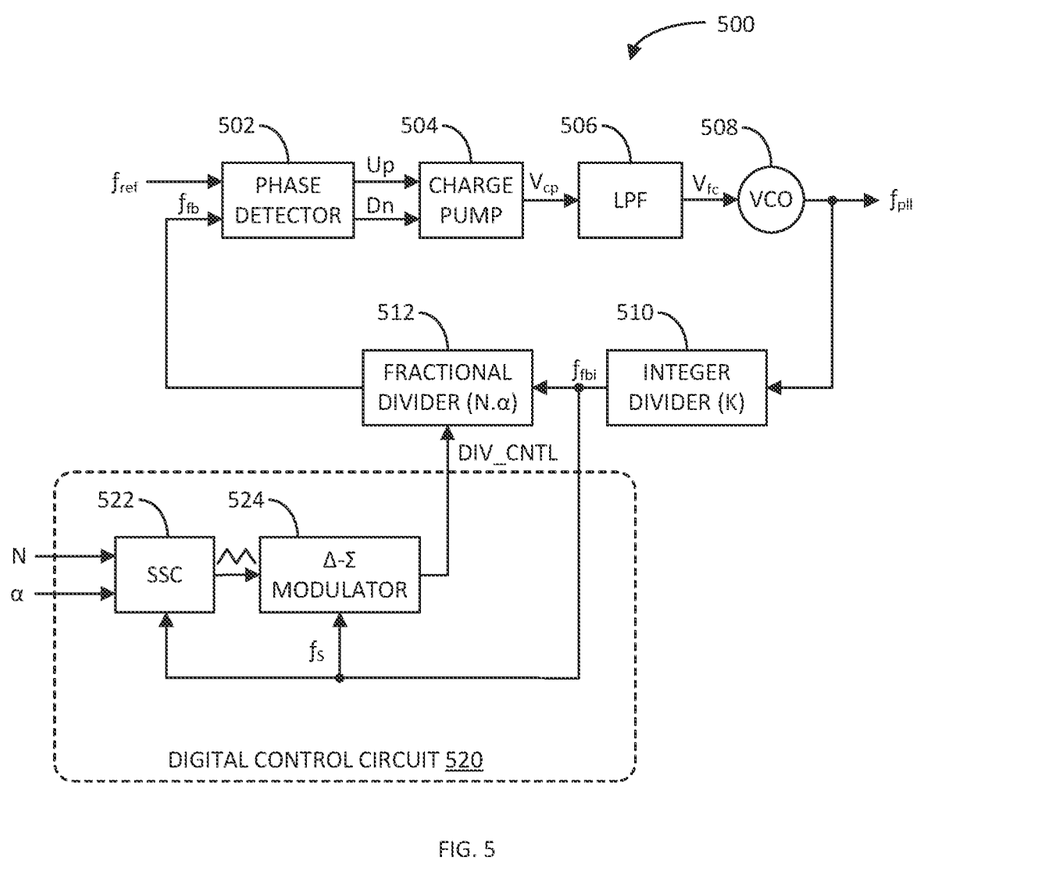
FIG. 5 illustrates a block diagram of another example fractional phase locked loop (PLL) in accordance with another aspect of the disclosure.

FIG. 5 illustrates a block diagram of another example fractional phase locked loop (PLL) 500 in accordance with another aspect of the disclosure. In PLL 500, the sampling clock driving a digital control circuit for a fractional frequency divider is generated by an integer frequency divider upstream of the fractional frequency divider (e.g., coupled between a VCO and the fractional frequency divider). Since the integer frequency divider is upstream of the fractional frequency divider, the sampling clock (e.g., the intermediate feedback clock $f_{fbi}$) for the digital control circuit has a frequency higher than the feedback clock $f_{fb}$. As a result, the quantization noise introduced by the digital control circuit is reduced, and pushed higher in frequency away from the fundamental frequency of the PIA, output clock $f_{pll}$. As previously discussed, this results in a significant reduction in jitter of the PLL output clock $f_{pll}$, which improves the operation of digital circuits driven by the PLL output clock $f_{pll}$.

The fractional PLL 500 includes a phase detector 502, a charge pump 504, a low pass filter (LPF) 506, a voltage-controlled oscillator (VCO) 508, an integer frequency divider 510, and a fractional frequency divider 512. The PLL 500 further includes a digital control circuit 520 for the fractional frequency divider 512. In this example, the digital control circuit 520 includes a spread spectrum clock (SSC) 522, and a delta-sigma (Δ-Σ) modulator 524.

The phase detector 502 compares the phase of a reference clock or signal $f_{ref}$ with the phase of a feedback clock $f_{fb}$ to generate Up (charging) and Down or Dn (discharging) control signals for the charge pump 504. With regard to the fractional PLL 114 of the data transmission system 100, the reference clock $f_{ref}$ in PLL 500 is the same as the reference clock $f_{ref}$ provided to the PLL 114. With regard to the CDR 156 of the data transmission system 100, the reference signal $f_{ref}$ in PLL 500 is the same as the serial data signal $D_S$ provided to the CDR 156.

In response to the control signals Up and Dn, the charge pump 504 generates a signal $V_{cp}$, which may be related to or a measure of a phase difference between the reference clock or signal $f_{ref}$ and the feedback clock $f_{fb}$. The LPF 506 integrates the charge pump signal $V_{cp}$ to generate a frequency control signal $V_{fc}$. The VCO 508 generates a PLL output clock $f_{pll}$ based on the frequency control signal $V_{fc}$. The integer frequency divider 510 frequency divides the PLL output clock $f_{pll}$ by an integer K to generate an intermediate feedback clock $f_{fbi}$ (e.g., $f_{fbi}=f_{pll}/K$). The fractional frequency divider 512 frequency divides the intermediate feedback clock $f_{fbi}$ by a number N·α to generate the feedback clock $f_{fb}$ (e.g., $f_{fb}=f_{fbi}/N·α$), wherein N is the integer divisor and α is the fractional divisor.

The digital control circuit 520 is configured to control the fractional frequency divider 512 such that it divides the frequency of the intermediate feedback signal $f_{fbi}$ by N·α. In this regard, the SSC 522 of the digital control circuit 520 is configured to receive a first signal to set the integer divisor N and a second signal to set the fractional divisor α, and generates a digital triangular waveform having a mean of N·α (e.g., with peaks at N·α±Δ) with a sampling rate dictated by a sampling clock $f_s$ being substantially the same as the intermediate feedback clock $f_{fbi}$ generated by the integer frequency divider 510. As previously discussed, the purpose of the SSC 522 is to spread the power of frequency tones in the PLL output clock $f_{pll}$ generated by the digital control circuit 520 across a range of frequencies dictated by the digital triangular waveform; otherwise, the power would be concentrated at individual tones associated with the sampling clock $f_s$, which may result in more distortion and/or noise of the PLL output clock $f_{pll}$.

The delta-sigma (Δ-Σ) modulator 524 is configured to generate a divider control signal DIV_CNTL including a digital sequence of integers that tracks the digital triangular waveform generated by the SSC 522; which, as discussed, has a mean N·α as the digital triangular waveform. In this implementation, the divider control signal DIV_CNTL has a sampling rate dictated by the sampling clock $f_s$ being the intermediate feedback clock $f_{fbi}$. The divider control signal DIV_CNTL is provided to the fractional frequency divider 512, which divides the intermediate feedback clock $f_{fbi}$ by the integer set by the digital sequence per a given cycle of the sampling clock $f_s$.

Due to the digital nature of the digital control circuit 520, the fractional frequency divider 512 divides the intermediate feedback clock $f_{fbi}$ by an integer per cycle of the sampling clock $f_s$, where the integer is varied to achieve a mean of N·α, i.e., the divider ratio of the fractional frequency divider 512. However, because frequency of the sampling clock $f_s$ is higher than the feedback clock $f_{fb}$ (e.g., $f_s=N·α*f_{fb}$), the SSC 522 and delta-sigma (Δ-Σ) modulator 524 are clocked at a higher rate or frequency compared to the feedback clock $f_{fb}$, which is used to clock the SSC 522 and delta-sigma (Δ-Σ) modulator 524 of PLL 500. As a result, the output PLL clock $f_{pll}$ has reduced quantization noise, and the quantization noise is pushed higher in frequency farther away from the output PLL clock $f_{pll}$, allowing the LPF 506 to further filter out the quantization noise.

Figure 6:
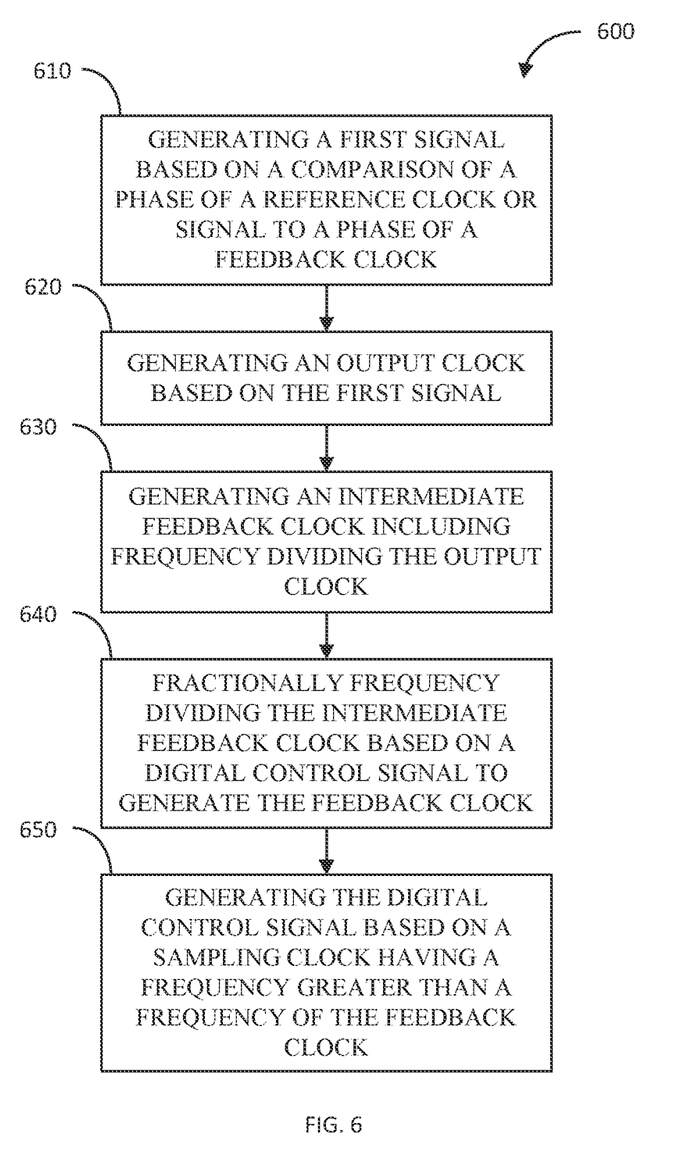
FIG. 6 illustrates a flow diagram of an example method of generating an output clock in accordance with another aspect of the disclosure.

FIG. 6 illustrates a flow diagram of an example method 600 of generating an output clock in accordance with another aspect of the disclosure. The method 600 includes generating a first signal based on a comparison of a phase of a reference clock or signal to a phase of a feedback clock (block 610). Examples of means of generating a first signal based on a comparison of a phase of a reference clock or signal to a phase of a feedback clock include any of the phase detectors, charge pumps, and low pass filters (LPFs) described herein.

The method 600 further includes generating an output clock based on the first signal (block 620). Examples of means for generating an output clock based on the first signal include any of the voltage-controlled oscillators (VCOs) described herein. Additionally, the method 600 includes generating an intermediate feedback clock including frequency dividing the output clock (block 630). Examples of means for generating an intermediate feedback clock including frequency dividing the output clock include any of the integer frequency dividers described herein.

Further, the method 600 includes fractionally frequency dividing the intermediate feedback clock based on a digital control signal to generate the feedback clock (block 640). Examples of means for fractionally frequency dividing the intermediate feedback clock based on a digital control signal to generate the feedback clock include any of the fractional frequency dividers described herein. Also, the method 600 includes generating the digital control signal based on a sampling clock having a frequency greater than a frequency of the feedback clock (block 650). Examples of means for generating the digital control signal based on a sampling clock having a frequency greater than a frequency of the feedback clock include any of digital control circuits 320, 420, and 520.

Additional operations pursuant to the method 600 may include generating the sampling clock including frequency multiplying the feedback clock. An example of a means for generating the sampling clock including frequency multiplying the feedback clock includes the frequency multiplier 426. The method 600 may include generating the sampling clock including frequency doubling the feedback clock. An example of a means for generating the sampling clock including frequency doubling the feedback clock includes the frequency multiplier 426.

According to the method 600, wherein generating the intermediate feedback clock includes frequency dividing the output clock by an integer. Examples of means for frequency dividing the output clock by an integer include any of the integer frequency dividers 410 and 510. Further, according to the method 600, wherein generating the digital control signal includes delta-sigma modulating a second signal using the sampling clock. Examples of means for delta-sigma modulating a second signal using the sampling clock include any of the delta-sigma (Δ-Σ) modulators 424 and 524. According to the method 600, wherein generating the digital control signal comprises applying spread spectrum to a second signal using the sampling clock to generate a third signal. Examples of means for applying spread spectrum to a second signal using the sampling clock to generate a third signal include any of the spread spectrum clock (SSC) 422 and 522 described herein.

Further, according to the method 600, wherein generating the first signal comprises driving a charge pump based on the comparison of the phase of the reference clock or signal to the phase of the feedback clock. Examples of means for generating the first signal comprises driving a charge pump based on the comparison of the phase of the reference clock or signal to the phase of the feedback clock include any of the phase detectors described herein. Additionally, the method 600 may include integrating a second signal generated by the charge pump, wherein generating the output clock is based on the second signal. Examples of means for integrating a second signal generated by the charge pump, wherein generating the output clock is based on the second signal include any of the low pass filters (LPFs) described herein, The following provides an overview of aspects of the present disclosure:

Aspect 1: A phase locked loop (PLL), including: a fractional frequency divider a phase detector including a first input configured to receive a reference clock or signal, and a second input coupled to an output of the fractional frequency divider; a voltage-controlled oscillator (VCO) including an input coupled to an output of the phase detector, and an output coupled to a first input of the fractional frequency divider; and a digital control circuit including a frequency multiplier including a first input coupled to the output of the fractional frequency divider, wherein the digital control circuit includes an output coupled to a second input of the fractional frequency divider, Aspect 2: The PLL of aspect 1, wherein the digital control circuit further includes a delta-sigma modulator including an input coupled to an output of the frequency multiplier.

Aspect 3: The PLL of aspect 1 or 2, wherein the digital control circuit further includes a spread spectrum clock (SSC) including a first input coupled to the output of the frequency multiplier.

Aspect 4: The PLL of aspect 3, wherein the SSC includes a second input configured to receive a second signal to set an integer divisor for the fractional frequency divider, Aspect 5: The PLL of aspect 3 or 4, wherein the SSC includes a second input configured to receive a second signal to set a fractional divisor for the fractional frequency divider.

Aspect 6: The PLL of any one of aspects 1-5, wherein the frequency multiplier includes a frequency doubler.

Aspect 7: The PLL of arty one of aspects 1-6, further including an integer frequency divider including an input coupled to the output of the VCO and an output coupled to the input of the fractional frequency divider, Aspect 8: The PLL of any one of aspects 1-7, further including a charge pump including an input coupled to the output of the phase detector and an output coupled to the input of the VCO.

Aspect 9: The PLL of any one of aspects 1-8, further including a filter including an input coupled to the output of the phase detector and an output coupled to the input of the VCO.

Aspect 10: The PLL of any one of aspects 1-9, wherein the first input of the phase detector is coupled to an output of a receiver circuit to receive the reference signal therefrom.

Aspect 11: A phase locked loop (PLL), including: a fractional frequency divider; an integer frequency divider including an output coupled to a first input of the fractional frequency divider; a phase detector including a first input configured to receive a reference clock or signal, and a second input coupled to an output of the fractional frequency divider; a voltage-controlled oscillator (VCO) including an input coupled to an output of the phase detector, and an output coupled to an input of the integer frequency divider; and a digital control circuit including a first input coupled to the output of the integer frequency divider, and an output coupled to a second input of the fractional frequency divider.

Aspect 12: The PLL of aspect 11, wherein the digital control circuit further includes a delta-sigma modulator including an input coupled to the output of the integer frequency divider.

Aspect 13: The PLL of aspect 11 or 12, wherein the digital control circuit further includes a spread spectrum clock (SSC) including a first input coupled to the output of the integer frequency divider.

Aspect 14: The PLL of aspect 13, wherein the SSC includes a second input configured to receive a second signal to set an integer divisor for the fractional frequency divider.

Aspect 15: The PLL of aspect 13 or 14, wherein the SSC includes a second input configured to receive a second signal to set a fractional divisor for the fractional frequency divider.

Aspect 16: The PLL of any one of aspects 11-15, further including a charge pump including an input coupled to the output of the phase detector and an output coupled to the input of the VCO.

Aspect 17: The PLL of any one of aspects 11-16, further including a filter including an input coupled to the output of the phase detector and an output coupled to the input of the VCO.

Aspect 18: The PLL of any one of aspects 11-17, wherein the first input of the phase detector is coupled to an output of a receive circuit to receive the reference signal therefrom.

Aspect 19: A method, including: generating a first signal based on a comparison of a phase of a reference clock or signal to a phase of a feedback clock; generating an output clock based on the first signal; generating an intermediate feedback clock including frequency dividing the output clock; fractionally frequency dividing the intermediate feedback clock based on a digital control signal to generate the feedback clock; and generating the digital control signal based on a sampling clock having a frequency greater than a frequency of the feedback clock.

Aspect 20: The method of aspect 19, further including generating the sampling clock including frequency multiplying the feedback clock, Aspect 21: The method of aspect 19, further including generating the sampling clock including frequency doubling the feedback clock.

Aspect 22: The method of any one of aspects 19-21, wherein generating the intermediate feedback clock includes frequency dividing the output clock by an integer.

Aspect 23: The method of any one of aspects 19-22, wherein generating the digital control signal includes delta-sigma modulating a second signal using the sampling clock.

Aspect 24: The method of any one of aspects 19-22, wherein generating the digital control signal includes applying spread spectrum to a second signal using the sampling clock to generate a third signal.

Aspect 25: The method of aspect 24, wherein generating the digital control signal further includes delta-sigma modulating the third signal using the sampling clock.

Aspect 26: The method of aspect 25, wherein the second signal sets a fractional divisor for the fractionally frequency dividing.

Aspect 27: The method of aspect 25 or 26, wherein le second signal sets an integer divisor for the fractionally frequency dividing.

Aspect 28: The method of any one of aspects 19-27, wherein generating the first signal includes driving a charge pump based on the comparison of the phase of the reference clock or signal to the phase of the feedback clock.

Aspect 29: The method of aspect 28, further including integrating a second signal generated by the charge pump, wherein generating the output clock is based on the second signal.

Aspect 30: A data receiver, includes: a receiver circuit configured to generate a serial data signal based on a transmit data signal received from a data transmitter via one or more transmission lines; a clock and data recovery (CDR) configured to generate a receive clock based on the serial data signal; and a deserializer configured to generate a second set of parallel data signals based on the second serial data signal using the receive clock; wherein the CDR includes: a fractional frequency divider; a phase detector including a first input configured to receive the serial data signal, and a second input coupled to an output of the fractional frequency divider; a voltage-controlled oscillator (VCO) including an input coupled to an output of the phase detector, and an output coupled to a first input of the fractional frequency divider; and a digital control circuit including a frequency multiplier including an input coupled to the output of the fractional frequency divider, wherein the digital control circuit includes an output coupled to a second input of the fractional frequency divider.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure, Thus, the disclosure is not intended to be limited to the examples described herein but is to be accorded the widest scope consistent with the principles and novel features disclosed herein.

What is claimed:

1. A phase locked loop (PLL), comprising:
    a fractional frequency divider;
    a phase detector including a first input configured to receive a reference clock or signal, and a second input coupled to an output of the fractional frequency divider;
    a voltage-controlled oscillator (VCO) including an input coupled to an output of the phase detector, and an output coupled to a first input of the fractional frequency divider;
    a digital control circuit comprising a frequency multiplier including a first input coupled to the output of the fractional frequency divider, wherein the digital control circuit includes an output coupled to a second input of the fractional frequency divider; and
    an integer frequency divider including an input coupled to the output of the VCO and an output coupled to the input of the fractional frequency divider.

2. The PLL of claim 1, wherein the digital control circuit further comprises a delta-sigma modulator including an input coupled to an output of the frequency multiplier.

3. The PLL of claim 1, wherein the digital control circuit further comprises a spread spectrum clock (SSC) including a first input coupled to the output of the frequency multiplier.

4. The PLL of claim 3, wherein the SSC includes a second input configured to receive a second signal to set an integer divisor for the fractional frequency divider.

5. The PLL of claim 3, wherein the SSC includes a second input configured to receive a second signal to set a fractional divisor for the fractional frequency divider.

6. The PLL of claim 1, wherein the frequency multiplier comprises a frequency doubler.

7. The PLL of claim 1, further comprising a charge pump including an input coupled to the output of the phase detector and an output coupled to the input of the VCO.

8. The PLL of claim 1, further comprising a filter including an input coupled to the output of the phase detector and an output coupled to the input of the VCO.

9. The PLL of claim 1, wherein the first input of the phase detector is coupled to an output of a receive circuit to receive the reference signal therefrom.

10. A method, comprising:
    generating a first signal based on a comparison of a phase of a reference clock or signal to a phase of a feedback clock;
    generating an output clock based on the first signal;
    generating an intermediate feedback clock including frequency dividing the output clock;
    fractionally frequency dividing the intermediate feedback clock based on a digital control signal to generate the feedback clock;
    generating the digital control signal based on a sampling clock having a frequency greater than a frequency of the feedback clock; and generating the sampling clock including frequency multiplying the feedback clock.

11. The method of claim 10, further comprising generating the sampling clock including frequency doubling the feedback clock.

12. The method of claim 10, wherein generating the intermediate feedback clock includes frequency dividing the output clock by an integer.

13. The method of claim 10, wherein generating the digital control signal comprises delta-sigma modulating a second signal using the sampling clock.

14. A method, comprising:
generating a first signal based on a comparison of a phase of a reference clock or signal to a phase of a feedback clock;
generating an output clock based on the first signal;
generating an intermediate feedback clock including frequency dividing the output clock;
fractionally frequency dividing the intermediate feedback clock based on a digital control signal to generate the feedback clock; and
generating the digital control signal based on a sampling clock having a frequency greater than a frequency of the feedback clock,
wherein generating the digital control signal comprises applying spread spectrum to a second signal using the sampling clock to generate a third signal.

15. The method of claim 14, wherein generating the digital control signal further comprises delta-sigma modulating the third signal using the sampling clock.

16. The method of claim 15, wherein the second signal sets a fractional divisor for the fractionally frequency dividing.

17. The method of claim 15, wherein the second signal sets an integer divisor for the fractionally frequency dividing.

18. The method of claim 10, wherein generating the first signal comprises driving a charge pump based on the comparison of the phase of the reference clock or signal to the phase of the feedback clock.

19. The method of claim 18, further comprising integrating a second signal generated by the charge pump, wherein generating the output clock is based on the second signal.

20. A data receiver, comprising:
a receiver circuit configured to generate a serial data signal based on a transmit data signal received from a data transmitter via one or more transmission lines;
a clock and data recovery (CDR) configured to generate a receive clock based on the serial data signal; and
a deserializer configured to generate a set of parallel data signals based on the serial data signal using the receive clock;
wherein the CDR comprises:
a fractional frequency divider;
a phase detector including a first input configured to receive the serial data signal, and a second input coupled to an output of the fractional frequency divider;
a voltage-controlled oscillator (VCO) including an input coupled to an output of the phase detector, and an output coupled to a first input of the fractional frequency divider; and
a digital control circuit comprising a frequency multiplier including an input coupled to the output of the fractional frequency divider, wherein the digital control circuit includes an output coupled to a second input of the fractional frequency divider.

* * * * *